(12) United States Patent
Hayashi et al.

(10) Patent No.: US 7,967,476 B2
(45) Date of Patent: Jun. 28, 2011

(54) LIGHT EMITTING DEVICE INCLUDING PROTECTIVE GLASS FILM

(75) Inventors: Tadao Hayashi, Tokushima (JP); Hiroto Tamaki, Anan (JP); Shoji Hosokawa, Tokushima (JP); Yasunori Shimizu, Tokushima (JP)

(73) Assignee: Nichia Corporation, Anan-shi (JP)

( * ) Notice: Subject to any disclaimer, the term of this patent is extended or adjusted under 35 U.S.C. 154(b) by 86 days.

(21) Appl. No.: 12/165,727

(22) Filed: Jul. 1, 2008

(65) Prior Publication Data
US 2009/0010017 A1 Jan. 8, 2009

(30) Foreign Application Priority Data

Jul. 4, 2007 (JP) .................... 2007-176288
Apr. 23, 2008 (JP) .................... 2008-112189

(51) Int. Cl.
*F21V 3/04* (2006.01)
*H01L 33/42* (2010.01)

(52) U.S. Cl. .............. 362/296.03; 362/310; 257/98; 257/100

(58) Field of Classification Search .......... 362/97.3, 362/249.02, 296.01, 307, 310, 296.02, 296.03, 362/296.04; 257/98–100
See application file for complete search history.

(56) References Cited

U.S. PATENT DOCUMENTS

| | | | | | |
|---|---|---|---|---|---|
| 3,764,862 | A | * | 10/1973 | Jankowski | 257/98 |
| 5,177,593 | A | * | 1/1993 | Abe | 257/98 |
| 5,747,623 | A | * | 5/1998 | Matsuo et al. | 528/14 |
| 6,355,946 | B1 | * | 3/2002 | Ishinaga | 257/98 |
| 6,707,069 | B2 | * | 3/2004 | Song et al. | 257/79 |
| 6,956,245 | B2 | * | 10/2005 | Senda et al. | 257/94 |
| 2003/0107316 | A1 | | 6/2003 | Murakami et al. | |
| 2003/0160256 | A1 | * | 8/2003 | Durocher et al. | 257/88 |
| 2004/0065894 | A1 | * | 4/2004 | Hashimoto et al. | 257/100 |
| 2004/0211970 | A1 | * | 10/2004 | Hayashimoto et al. | 257/98 |
| 2007/0190308 | A1 | * | 8/2007 | Brand et al. | 428/323 |
| 2008/0079018 | A1 | * | 4/2008 | Kimura et al. | 257/98 |
| 2008/0118651 | A1 | * | 5/2008 | Brand et al. | 427/409 |
| 2009/0098300 | A1 | * | 4/2009 | Brand et al. | 427/387 |

FOREIGN PATENT DOCUMENTS

JP 2000-299503 A 10/2000

* cited by examiner

*Primary Examiner* — Ismael Negron

(74) *Attorney, Agent, or Firm* — Global IP Counselors, LLP

(57) ABSTRACT

A light emitting device includes a metal reflecting member, a light emitting element fixed to the metal reflecting member, a glass film that covers the metal reflecting member and has Si—N bonds, and a translucent resin that covers the glass film.

14 Claims, 1 Drawing Sheet

LIGHT EMITTING DEVICE INCLUDING PROTECTIVE GLASS FILM

BACKGROUND OF THE INVENTION

1. Field of the Invention

This invention relates to a light emitting device sealed a light emitting element with translucent sealing material.

2. Background Information

There has been a variety of proposals for light emitting devices in which lighting source is a light emitting element. For instance, a light emitting device in which a glass material covers a light emitting element and close thereto (see JP-2000-299503-A).

However, the glass sealed body formed by hydrolytic polymerization by sol-gel method is formed much thicker than the thickness of a light emitting element, and it is therefore believed to be susceptible to cracking due to shrinkage in the course of molding, and such glass film has extremely poor gas barrier performance.

When a light emitting device is to be used in a harsh environment, it is common for the plastic material that is used to be one with excellent resistance to heat and weathering. However, plastic materials with excellent resistance to heat and weathering tend to have low gas barrier performance.

In particular, when the mounting component of a light emitting device designed for automotive use is made from a metal reflecting member, the mounting component undergoes sulfide blackening under the effects of high temperature and humidity in the atmosphere and the heat generated by the light emitting element, and this can markedly lower the output of the light emitting device.

SUMMARY OF THE INVENTION

The present invention was conceived in light of the above problems, and it is an object thereof to provide a light emitting device with which, even when this device is used in a harsh environment, there will be no deterioration in the light reflecting performance of the metal reflecting member, and light can be emitted at high output over an extended period.

The present invention provides a light emitting device comprising a metal reflecting member, a light emitting element fixed to the metal reflecting member, a glass film that covers the metal reflecting member and has Si—N bonds, and a translucent resin that covers the glass film.

The light emitting device of the present invention has a glass film with Si—N bonds as an essential component, which provide high gas barrier performance, between the translucent resin and the metal reflecting member provided at a location that will be directly affected by the heat generated by the light emitting element, so even when this device is used in a harsh environment, there will be no deterioration in the light reflecting performance of the metal reflecting member, and light can be emitted at high output over an extended period.

DETAILED DESCRIPTION OF THE PREFERRED EMBODIMENTS

The best mode for carrying out the invention will now be described through reference to the drawings, but the mode described below merely exemplifies a semiconductor device manufacturing method for embodying the technological concepts of the present invention, and the present invention is not limited to the semiconductor device manufacturing method discussed below.

Also, this Specification does not limit the members given in the Claims to the members of the embodiments. The sizes, materials, shapes, relative disposition, and so forth of the constituent members discussed in the embodiments are not unless, otherwise specified, intended to limit the scope of the invention to just those, and are merely given as descriptive examples. Furthermore, the size, positional relationships, and so forth of the members illustrated in the various diagrams may be exaggerated in order to make the description more clear.

Further, in the following description, members that are the same or have the same properties are given the same names and numbers, and their detailed description may be omitted as appropriate. Furthermore, the various elements that make up the semiconductor device of the present invention may be in a mode such that a plurality of elements are constituted by the same member, and a plurality of elements all serve as a single member, or conversely, the function of a single member may be allocated to a plurality of members.

The preferred embodiments of a light emitting device of the present invention will be described below with reference to the accompanying drawings.

Figure 1:
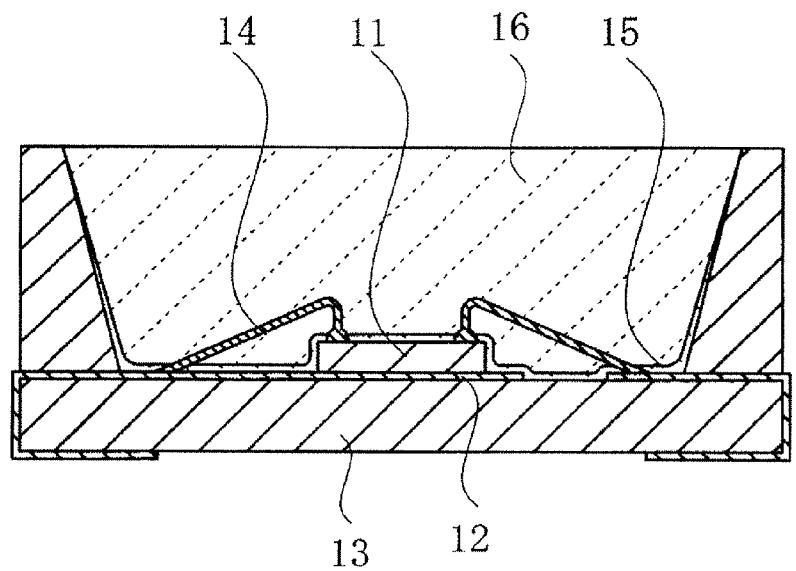
FIG. 1 is simplified cross section illustrating the structure of the light emitting device of the present invention.
Figure 2:
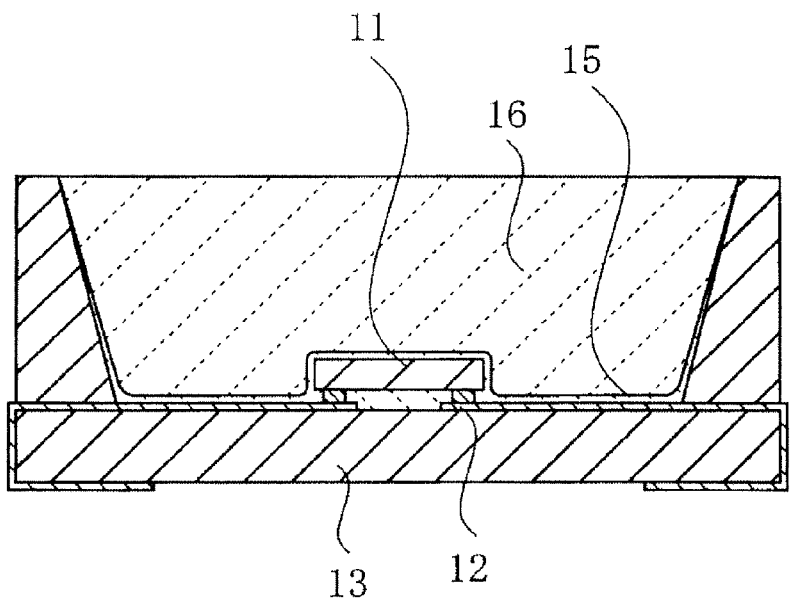
FIG. 2 is simplified cross section illustrating the structure of the light emitting device of the present invention.

As shown in FIG. 1, a light emitting device includes a light emitting element 11, and a metal reflecting member 12 to which the light emitting element fixed electrically and mechanically, the light emitting element 11 and the metal reflecting member 12 are covered by a glass film having Si—N bonds as a essential component, and a translucent resin in this order.

Light Emitting Element 11

The light emitting element 11 has a plurality of electrodes (not shown) formed on its surface, and the electrodes are electrically connected with a pair of metal reflecting members 12 by conductive wires 14. The light emitting element 11 used in this embodiment has positive and negative electrodes formed on the same side, but the positive and negative electrodes may instead be formed on different sides. Also, it is not necessarily the case that one each of the positive and negative electrodes are formed, and two or more of each may be formed instead.

Also, if the light emitting device is to be equipped with a fluorescent substance, it preferably has a semiconductor light emitting element capable of emitting light that excites the fluorescent substance.

Examples of this semiconductor light emitting element include ZnSe, GaN, and various other semiconductors, but a nitride semiconductor capable of emitting short-wavelength light that can efficiently excite the fluorescent substance is especially favorable. The emission wavelength can be variously selected according to the material of the semiconductor layer and its crystallinity.

The light emitting element 11 in this embodiment is fixed to the surface of the metal reflecting members 12 with a bonding member (not shown), but this is not the only possibility, and it may instead be directly fixed to the surface of a support 13 (discussed below), or may be fixed via a heat sink in between these fixing locations.

When a glass film having Si—N bonds as an essential component is formed up to the interface with the light emitting element 11 as in the this embodiment, this prevents degradation of the light emitting element by moisture and corrosive gases.

More specifically, there are two types of degradation of a light emitting element; one is when the constitute atoms of the light emitting element are dissolved by moisture, and output decreases; the other is when the electrodes of the light emitting element are corroded by corrosive gases, such as nitrogen oxides or sulfur oxides, or under conditions of high humidity, and Vf is diminished. These problems can be avoided by forming the above-mentioned glass film on the element surface. The result is that with the light emitting device in this embodiment, even it makes use of a GaAs-based or GaP-based light emitting element that is prone to degradation by moisture from the outside, a light emitting device with high light take-off efficiency can be obtained regardless of the usage environment or the material of the translucent resin.

Metal Reflecting Members 12

The metal reflecting members 12 used in the present invention are made from a material capable of reflecting at least 70% of the light from the installed light emitting element 11. Also, the metal reflecting members 12 in this embodiment have electrical polarity, but are not limited to this, and may not have electrical polarity, and may be independent from the conductive members. Also, the metal reflecting members 12 may be formed by plating the outer most surface of other members, for example. If the metal reflecting members 12 are formed on a base of conductive members, then they need to have good adhesion and electrical conductivity with the members used to electrically connect with the light emitting element. The electrical resistance is preferably at most 300 $\mu\Omega$/cm, and more preferably at most 3 $\mu\Omega$/cm. More specifically, it is preferably to use a metal such as cupper, aluminum, gold, silver, tungsten, iron, nickel, etc.; a metal alloy such as iron-nickel, phosphor bronze, etc.; or a combination thereof.

The metal reflecting members 12 of the present invention are located near the light emitting element 11. Therefore, degradation of the metal reflecting member greatly affects the optical output of the light emitting device and wavelength (i.e., color) thereof. In this embodiment, a glass film having Si—N bonds as an essential component is provided at the interface between the metal reflecting members 12 and a resin 16 (discussed below), which prevents a decrease in the output of the light emitting device attributable to resultant discoloration of the metal reflecting member, maintains the wavelength dependence of the optical reflectivity, and prevents a change in the emission light color.

In particular, a metal reflecting member 12 at least the outer surface of which is made from silver or an alloy whose essential component is silver will be badly degraded by gases, and was therefore unsuited in the past to a light emitting device to be used under high temperature and humidity conditions, but by applying the present invention, a light emitting device with high light take-off efficiency can be obtained regardless of the usage environment or the material of the translucent resin.

The outer surface of the metal reflecting members 12 is preferably textured in order to take off the light from the installed light emitting element more efficiently to the outside. Also, if the outer surface of the metal reflecting members 12 is textured (i.e., having microscopic projections and depressions, or irregularity) this improves adhesion with the glass film (discussed below) and relieves shrinkage stress during the formation of the glass film 15. This makes it possible to form a glass film 15 with excellent corrosion resistance and substantially no cracks on the surface of the metal reflecting members 12.

Furthermore, the surface of the metal reflecting members 12 preferably protrudes beyond the surface of the support 13 having insulating property (discussed below). The result of this is that when the glass film 15 is formed on the surface of the metal reflecting members 12, excess material used to form the glass film flows onto the surface of the support 13, allowing a glass film of the proper thickness to be formed on the surface of the metal reflecting members 12. This makes it easier to form a glass film 15 with substantially no cracks on the surface of the metal reflecting members 12.

In this embodiment, a light emitting device was described in which a light emitting element was fixed alone to a conductive member, but the invention is not limited to an aspect in which a light emitting element is disposed by itself, and can also be a light emitting device in which a light emitting element and a static protection element, or a combination of two or more types of these, are installed. When polarity with the light emitting element is taken into account, the static protection element may be disposed on either the same conductive member as the light emitting element, or on a different conductive member.

Support 13

The support 13 may be formed from any material, as long as it allows the metal reflecting members 12 to be supported on the surface. The material includes ceramics, white resin, etc., as well as an insulating and light shielding substance, or the like. It is preferably formed from a material with a small difference in its coefficient of thermal expansion from that of the glass film 15, so that good adhesion can be maintained even if the glass film 15 is swollen by heat produced form the light emitting element 11, etc.

Bonding Member

A metal material is preferably used for the bonding member that is used here to fix the light emitting element 11 to the metal reflecting members 12. This prevents degradation and discoloration of the bonding member by heat or optical irradiation from the light emitting element, and the optical absorption that accompanies such degradation and discoloration. Specifically, it is preferably to use a metal such as silver etc., a metal alloy such as Au—Sn, Ag—Sn, Sn—Ag—Cu, Sn—Pb In—Sn etc.

As shown in FIG. 1, when a light emitting element having positive and negative electrodes are on the same side is used, and the side on which the electrodes are not formed is fixed to the conductive member, it is preferable for a metal film to be formed ahead of time by sputtering, vapor deposition, plating, or the like on the side on which the electrodes are not formed, and this film then used to fix to the conductive member. The result is that a light emitting device with excellent heat dissipation efficiency can be obtained.

More specifically, a paste in which a metal material and a flux are mixed is used to coat the conductive member by dispenser, pin transfer, printing, etc. A light emitting element on which a metal film has been formed is placed over this paste, and can be bonded by reflow by heating and melting the metal material. When the light emitting element is one that has positive and negative electrodes on opposite sides, a metal or metal alloy (such as Ni, Ti, Au, Pt, Pd, W or the like) film consisting of a single layer or laminated layers is preferably applied to the surface of the electrodes, and bonded to the metal reflecting members with a metal material by the same method as described above.

Conductive Wires 14

When the electrode surfaces of the light emitting element 11 are electrically connected without being opposite a conductive member, conductive wires 14 are used. The conductive wires 14 need to have good thermal conductivity, electrical conductivity, mechanical connectability, and ohmic properties with the electrodes of the light emitting element.

Example of the conductive wires include a wire composed of a metal such as gold, cupper, platinum, aluminum, etc., and a metal alloy thereof.

Glass Film 15

The metal reflecting members 12 of the present invention are covered by a glass film 15 having as an essential component Si—N bonds with high gas barrier performance. The glass film 15 of the present invention is disposed so as to be in contact with both the metal reflecting members 12 and a translucent resin 16, but is not limited to this, and the effect of the present invention can be obtained as long as this film is at least present between the metal reflecting members 12 and the translucent resin 16. In this Specification, the term "glass material having Si—N bonds" as an essential component specifically refers to an incomplete state of perhydropolysilazane conversion, in which are present Si—N bonds of unreacted groups.

This glass film 15 can be obtained by the following steps.

First, perhydropolysilazane is diluted to a concentration of about 0.1 to 10% with a solvent containing no water, such as xylene, and the resulting solution is used to coat the surface of the metal reflecting members 12 and the light emitting element 11. The coating thickness may be suitably selected as dictated by the concentration of the perhydropolysilazane and the structure of the film formation surface, so that the film thickness after curing may be at least 0.05 μm and no more than 5 μm. After coating, the film is allowed to stand for about 5 hours at normal temperature to volatilize the solvent, after which the film is heated for 5 hours in an about 200° C. atmospheric oven to promote a vitrification reaction.

The method used here to obtain the glass film of the present invention comprises a first step of diluting the main glass material in a nonaqueous solvent, a second step of coating with the solution obtained in the first step and volatilizing the solvent component at a temperature of at least 25° C. and no higher than 90° C., and a third step of curing at a temperature of at least 100° C. and no higher than 300° C. The result is a glass film that is not completely inorganic, and a protective film that has Si—N bonds as an essential component and is flexible with respect to increased shrinkage stress.

More specifically, including the above-mentioned first step reduces the film thickness by eliminating the solvent, and including the above-mentioned second step allows the film to be formed in a uniform thickness. The effect of performing the third step after the first and second steps is that a glass film in which Si—N bonds are an essential component can be obtained.

The glass film 15 of the present invention preferably also has Si—H bonds, in which case a light emitting device with even better reliability can be obtained. Also, the thickness of the glass film 15 of the present invention is preferably at least 0.05 μm and no more than 5 μm, in which case the resulting glass film will have high gas barrier performance and will allow light from the light emitting element to be taken off to the outside more efficiently. This is because it ensures that the light emitting element and the conductive member will be protected, and prevents a loss of gas barrier performance or the occurrence of cracking during manufacture or when the device is lit. When a high-power light emitting device is to be formed, if we take into account the amount of heat generated by the light emitting element, the thickness of the glass film is preferably at least 0.1 μm and no more than 2 μm. The "film thickness" referred to here is the average value of the film thickness in-plane.

Translucent Resin 16

The translucent resin 16 of the present invention is formed so as to cover the glass film 15. The translucent resin 16 may be formed from any resin material, as long as it is translucent to the light of the installed light emitting element. Example of the translucent resin 16 includes silicone resin, polyphthal amide (PPA), polycarbonate resin, polyphenylene sulfide (PPS), liquid crystal polymer (LCP), ABS resin, epoxy resin, phenol resin, acrylic resin, PBT resin, and the like. A variety of dyes and pigments are used and mixed as a colorant. Example of the colorant includes $Cr_2O_3$, $MnO_2$, $FeO_3$, carbon black, and the like.

Also, the light emission side of a sealing resin can be given the desired shape so as to impart a lens effect. More specifically, it can be given a convex lens shape, a concave lens shape, or an elliptical shape as viewed from the side where the light emission is seen, or a combination of two or more of these shapes. The term "translucent" as used in this Specification means the property of transmitting at least about 70% of the light emitted from the light emitting element.

The translucent resin 16 may contain a light diffusing material or a wavelength conversion member.

A light diffusing material is one that diffuses light, and allows the directionality from the light emitting element to be lessened, and the viewing angle to be increased.

A wavelength conversion member is one that converts the light from the light emitting element, and allows the wavelength of the light emitted from the light emitting element to the outside of the sealing member to be converted. Example of the wavelength conversion member is a fluorescent substance. When the light from the light emitting element is visible light with a short wavelength and high energy, a variety of materials can be used, such as a perylene derivative which is an organic fluorescent substance, or an inorganic fluorescent substance such as nitrogen-containing $CaO$—$Al_2O_3$—$SiO_2$ activated with europium and/or chromium, YAG:Ce, or ZnCdS:Cu.

With the present invention, when white light is to be obtained, and particularly when a YAG:Ce fluorescent substance is utilized, allowing white light to be formed reliably and with relative ease because, depending on the amount contained, it is possible to emit light from a blue light emitting element, and yellow light which is a complementary color and absorbs some of this blue light. Similarly, when nitrogen-containing $CaO$—$Al_2O_3$—$SiO_2$ activated with europium and/or chromium is utilized, depending on the amount contained, it is possible to emit light from a blue light emitting element, and red light which is a complementary color and absorbs some of this blue light, allowing white light to be formed reliably and with relative ease. Further, it is possible to use any known fluorescent substances such as those described in JP-2005-19676-A, and JP-2005-8844-A.

Also, with the present invention, the metal reflecting members 12 are securely protected by the glass film, so an inexpensive sulfide fluorescent material can also be used. Example of the sulfide fluorescent materials includes alkali earth metal-based, thiogallate-based, thiosilicate-based, zinc sulfide-based, acid sulfide-based, and the like.

Example of the alkali earth metal-based fluorescent material includes MS:Rn (where M is one or more elements selected from Mg, Ca, Sr and Ba; Re is one or more elements selected from Eu and Ce).

Example of the thiogallate-based fluorescent material includes $MN_2S_4$:Rn (where M is the same meaning of the above, N is one or more elements selected from Al, Ga, In and Y; Re is the same meaning the above).

Example of the thiosilicate-based fluorescent material includes $M_2LS_4$ (where M is the same meaning the above, L is one or more elements selected from Si, Ge and Sn; Re is the same meaning the above).

Example of the zinc sulfide-based fluorescent material includes ZnS:K (K is one or more elements selected from Ag, Cu and Al).

Example of the acid sulfide-based fluorescent material includes $Ln_2O_2S$:Re (Ln is one or more elements selected from Y, La and Gd).

The light emitting device of the present invention can be applied to a wide range of illumination light sources, various indicators, vehicle lamps, display light sources, backlight light sources, sensor light sources, traffic light, vehicle products, channel letter for advertising, and various other types of illuminating apparatus.

This application claims priority to Japanese Patent Application Nos. 2007-176288 and 2008-112189. The entire disclosure of Japanese Patent Application Nos. 2007-176288 and 2008-112189 is hereby incorporated herein by reference.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing descriptions of the embodiments according to the present invention are provided for illustration only, and not for the purpose of limiting the invention as defined by the appended claims and their equivalents. Thus, the scope of the invention is not limited to the disclosed embodiments.

What is claimed is:

1. A light emitting device comprising:
a metal reflecting member;
a light emitting element fixed to the metal reflecting member;
a glass film that continuously covers at least a portion of the metal reflecting member and a portion of the light emitting element, the glass film having Si—N bonds; and
a translucent resin that covers the glass film.

2. A light emitting device comprising:
a support;
a metal reflecting member formed on a surface of the support such that a part of the surface of the support is not covered by the metal reflecting member;
a light emitting element fixed to the metal reflecting member;
a glass film that continuously covers at least a portion of the part of the surface of the support and at least a portion of the metal reflecting member, the glass film having Si—N bonds; and
a translucent resin that covers the glass film.

3. The light emitting device of claim 1, wherein the glass film is provided at the interface between the metal reflecting member and the translucent resin.

4. The light emitting device of claim 1, wherein the light emitting element is covered by the glass film and the translucent resin in this order.

5. The light emitting device of claim 1, wherein the glass film also has Si—H bonds.

6. The light emitting device of claim 1, wherein the glass film has a thickness of at least 0.05 μm and no more than 5 μm.

7. The light emitting device of claim 1, wherein the metal reflecting member is composed of a material including silver.

8. The light emitting device of claim 1, wherein the light emitting element is fixed to the metal reflecting member with a metal material.

9. The light emitting device of claim 1, wherein the glass film is composed of a material with an incomplete state of perhydropolysilazane conversion.

10. The light emitting device of claim 1, wherein the metal reflecting member is electrically connected to the light emitting element.

11. The light emitting device of claim 1 wherein a portion of the metal reflecting member is disposed between the light emitting element and the support.

12. The light emitting device of claim 1, wherein an electrical resistance of the metal reflecting member is at most 3 μΩ/cm.

13. The light emitting device of claim 1, wherein at least an outer surface of the metal reflecting member is made from silver.

14. The light emitting device of claim 1, wherein an outer surface of the metal reflecting member is textured.

* * * * *